(12) United States Patent
Liu et al.

(10) Patent No.: US 7,488,180 B2
(45) Date of Patent: Feb. 10, 2009

(54) TESTING DEVICE

(75) Inventors: In-Hui Liu, Taipei (TW); Tien-En Hsu, Taipei (TW)

(73) Assignee: Asutek Computer Inc., Taipei (TW)

( * ) Notice: Subject to any disclaimer, the term of this patent is extended or adjusted under 35 U.S.C. 154(b) by 0 days.

(21) Appl. No.: 11/808,670

(22) Filed: Jun. 12, 2007

(65) Prior Publication Data
US 2007/0287305 A1 Dec. 13, 2007

(30) Foreign Application Priority Data
Jun. 13, 2006 (TW) .............................. 95121078 A

(51) Int. Cl.
*H01R 12/00* (2006.01)

(52) U.S. Cl. ......................................... 439/65; 439/61

(58) Field of Classification Search ................... 439/65, 439/61
See application file for complete search history.

(56) References Cited

U.S. PATENT DOCUMENTS 6,976,848 B2 * 12/2005 Choi ........................... 439/61

* cited by examiner

*Primary Examiner*—Truc T Nguyen
(74) *Attorney, Agent, or Firm*—Birch, Stewart, Kolasch & Birch, LLP

(57) ABSTRACT

A testing device is disclosed for testing a first circuit board having a first connector. The testing device includes a protective casing, a second circuit board, a second connector and a third circuit board. At least one portion of the second circuit board is disposed in the protective casing. The second connector has a first side, which is electrically connected to the second circuit board, and a second side. The third circuit board has a third side electrically connected to the second side of the second connector, and a fourth side electrically connected to the first circuit board.

9 Claims, 5 Drawing Sheets

TESTING DEVICE

BACKGROUND OF THE INVENTION

1. Field of Invention

The invention relates to a testing device, and, in particular, to a testing device for testing a circuit board.

2. Related Art

Current circuit boards have to be tested many times during the manufacturing process. For example, when a mainboard is being manufactured, a tester has to test the mainboard using many apparatuses and consumable material resources so as to check whether the functions of the mainboard meet the specifications.

Referring to FIG. 1, in a conventional method of testing a circuit board, a tester inserts a memory 11 into a memory socket 13 on a circuit board 12 so as to test whether the operations between the memory 11 and the circuit board 12 are normal.

However, when the tester holds the memory 11 to insert the memory 11 into the circuit board 12 or remove the memory 11 from the circuit board 12, the memory 11 often becomes damaged and the test becomes abnormal. For example, when the memory 11 is repeatedly inserted and removed, components 111 on the memory 11 tend to develop solder cracks and fail. In addition, contact elements, such as golden fingers 112, between the memory 11 and the memory socket 13 may also be worn and oxidized seriously so as to cause an increase in the impedance of the element and the deformations of the element. More, when the tester is taking the memory 11, the memory 11 may be hit and damaged. Therefore, when the memory 11 is damaged as mentioned above, it must be replaced and the manufacturing cost will be increased.

Thus, it is an important subject of the invention to provide a testing device for solving the above-mentioned problem, so as to enhance the test efficiency and accuracy, and decrease the manufacturing cost.

SUMMARY OF THE INVENTION

It is therefore an object of the invention to provide a testing device capable of enhancing the test efficiency and accuracy, and reducing the manufacturing cost.

To achieve the above-identified object, the invention provides a testing device for testing a first circuit board having a first connector. The testing device includes a protective casing, a second circuit board, a second connector and a third circuit board. At least one portion of the second circuit board is disposed in the protective casing. The second connector has a first side, which is electrically connected to the second circuit board, and a second side. The third circuit board has a third side, which is electrically connected to the second side of the second connector, and a fourth side, which is electrically connected to the first connector.

As mentioned hereinabove, in the testing device according to the invention, the second circuit board is electrically connected to the first circuit board through the second connector and the third circuit board. In addition, the testing device further has the protective casing for protecting the second circuit board. Compared with the prior art, when the tester is testing, he or she does not have to directly contact the second circuit board, but contacts the protective casing. So, the electronic elements on the second circuit board cannot be damaged. In addition, because of the protection of the protective casing, the second circuit board cannot be hit and damaged. Also, when the testing device is inserted and removed, the third circuit board is inserted into the first connector on the first circuit board or is pulled out of the first connector. So, the second circuit board cannot be worn due to the repeated insertion and removal operations. Thus, the second circuit board is not damaged during the test, the testing efficiency and accuracy can be increased, and the manufacturing cost can be reduced.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The testing device according to the preferred embodiment of the invention will be described with reference to the accompanying drawings.

Figure 1:
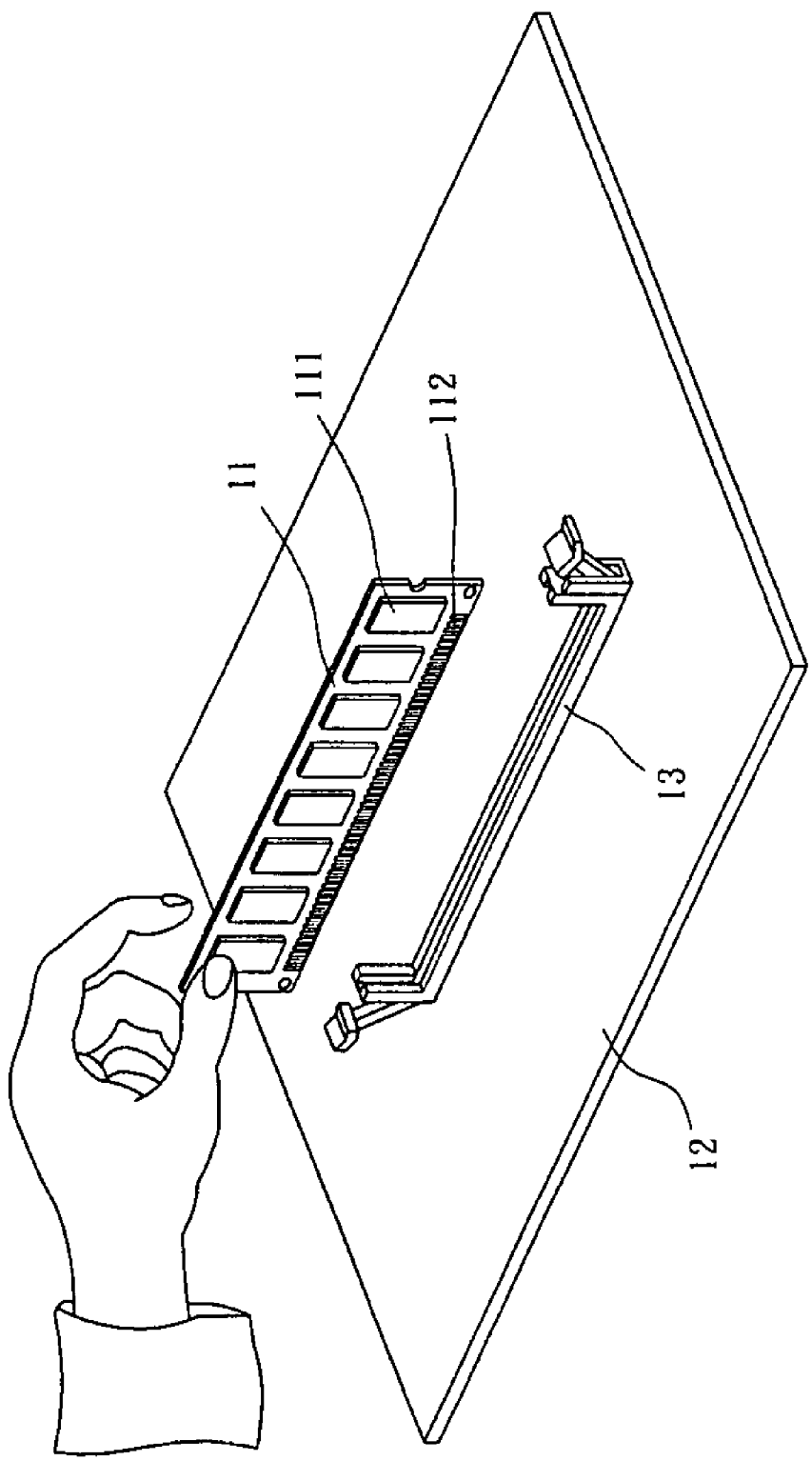
FIG. 1 is a schematic illustration showing a conventional method of testing a circuit board.
Figure 2:
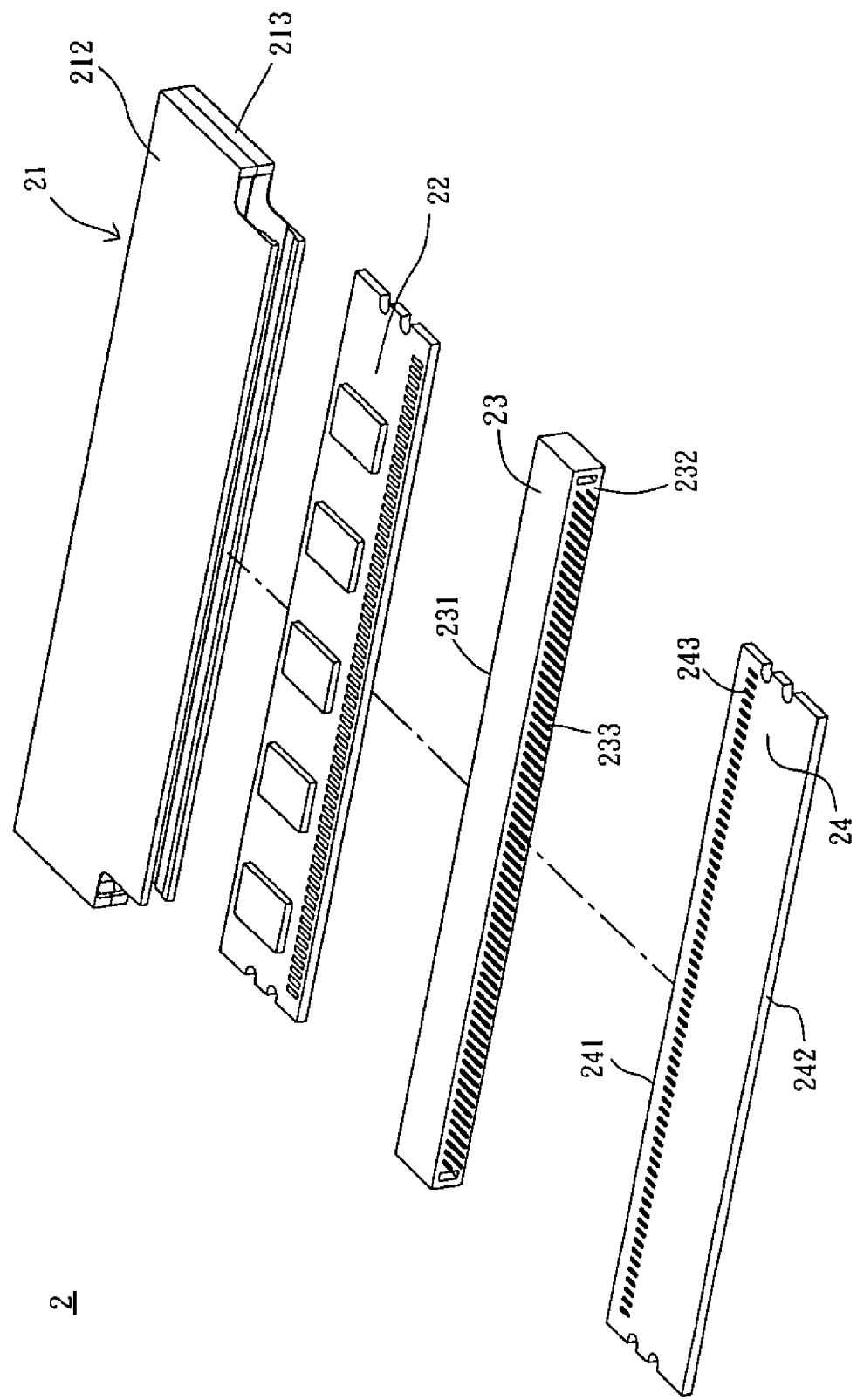
FIG. 2 is a partial exploded schematic illustration showing a testing device according to a preferred embodiment of the invention.
Figure 3:
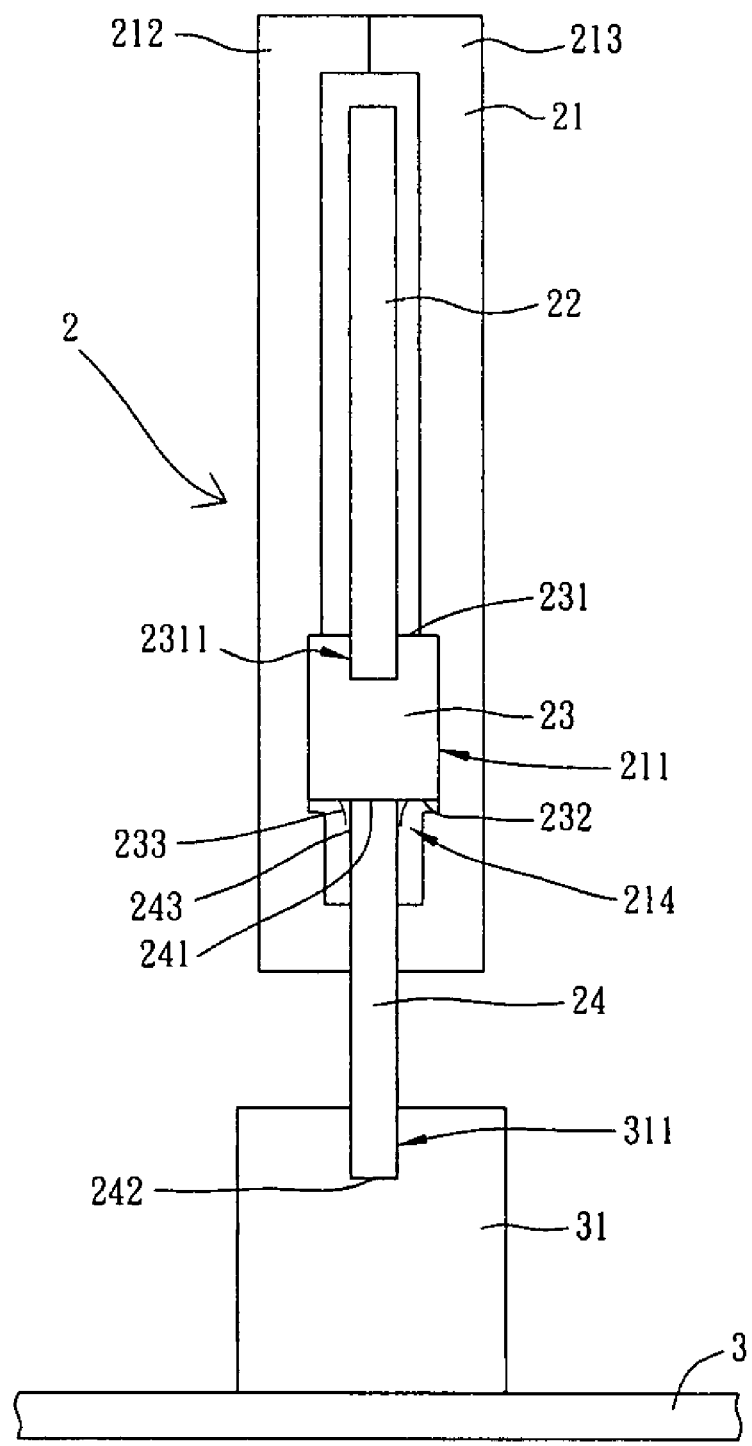
FIG. 3 is a cross-sectional view showing the testing device according to the preferred embodiment of the invention.

As shown in FIGS. 2 and 3, a testing device 2 according to a preferred embodiment of the invention is used to test a first circuit board 3 having a first connector 31. The first circuit board 3 in this embodiment may be a mainboard, and the first connector 31 may be a socket on the mainboard. For example, the first connector 31 may be a peripheral component interconnect (PCI) socket or a dual in line memory module (DIMM) socket.

Referring again to FIGS. 2 and 3, the testing device 2 of this embodiment includes a protective casing 21, a second circuit board 22, a second connector 23 and a third circuit board 24.

The second circuit board 22 may be any interface card, such as a network interface card, a display interface card and the like, or a memory module. The second connector 23 is a connector corresponding to the second circuit board 22, and the third circuit board 24 is a printed circuit board for transfer connection.

As shown in FIGS. 2 and 3, at least one portion of the second circuit board 22 is disposed in the protective casing 21. The second connector 23 has a first side 231 and a second side 232 disposed opposite to each other, and the first side 231 is electrically connected to the second circuit board 22. In addition, the third circuit board 24 has a third side 241 and a fourth side 242 disposed opposite to each other. The third side 241 is electrically connected to the second side 232 of the second connector 23. Furthermore, the fourth side 242 of the third circuit board 24 is inserted into the first connector 31 so that the fourth side 242 of the third circuit board 24 is electrically connected to the first circuit board 3.

Referring again to FIG. 3, the first side 231 of the second connector 23 of this embodiment has a slot 2311, and the second circuit board 22 is inserted into the slot 2311 and electrically connected to the second connector 23. In addition, the second side 232 of the second connector 23 has a plurality of first connection portions 233, and the third side 241 of the third circuit board 24 has a plurality of second connection portions 243. The first connection portions 233 are respectively connected to the second connection portions 243 so that the second connectors 23 are electrically connected to the third circuit board 24. Herein, the first connection portion 233 may be a terminal, and the second connection portion 243 may be a bonding point. The first connection portions 233 may be correspondingly bonded to the second connection portions 243. In addition, the first connector 31 has a slot 311, and the fourth side 242 of the third circuit board 24 may be inserted into the slot 311 so that the third circuit board 24 is electrically connected to the first connector 31.

In addition, as shown in FIGS. 2 and 3, the protective casing 21 of this embodiment is composed of an upper cover 212 and a lower cover 213, and the upper cover 212 may be connected to the lower cover 213 by way of adhering, engaging or locking. Herein, the protective casing 21 may cover the second circuit board 22, the second connector 23 and one portion of the third circuit board 24.

Furthermore, the protective casing 21 of this embodiment has a concave portion 211, as shown in FIG. 3. The arrangement position of the concave portion 211 corresponds to the second connector 23 so that the second connector 23 may be partially accommodated in the concave portion 211. Thus, the concave portion 211 can restrict the position of the second connector 23 in the protective casing 21. Herein, the protective casing 21 protects the second circuit board 22 so that when the tester is applying a force, the force is applied to the second connector 23 through the protective casing 21 but not to the second circuit board 22. Thus, the second circuit board 22 is well protected. In addition, the protective casing 21 also has a reserved space 214 for the first connection portion 233 and the second connection portion 243 to prevent the first connection portion 233 and the second connection portion 243 from contacting the protective casing 21. Thus, the damage of the first connection portion 233 and the second connection portion 243 can be prevented, and/or the damage of the surface of the protective casing 21 also can be prevented.

In this embodiment, the protective casing 21 may be made of an aluminum oxide material, which has high intensity and good insulation properties. Of course, the protective casing 21 may also be made of another material having high intensity and good insulation properties.

In the following, the steps of assembling the protective casing 21 with the second circuit board 22, the second connector 23 and the third circuit board 24 are disclosed with reference of FIGS. 4A to 4C.

Figure 4A:
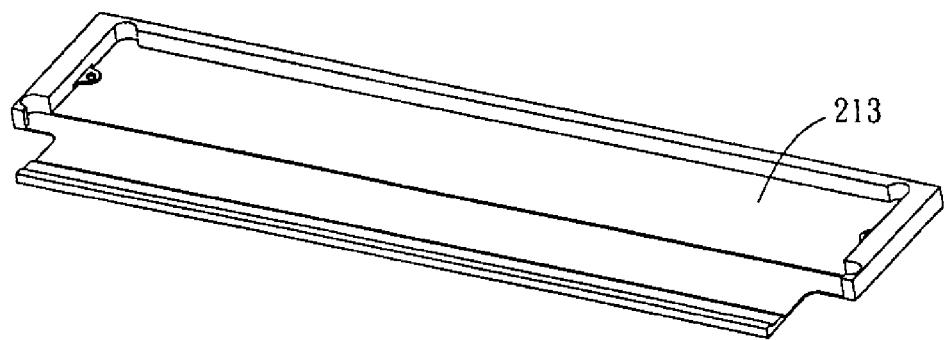
FIGS. 4A to 4C are assembling illustrations showing the testing device according to the preferred embodiment of the invention.
Figure 4B:
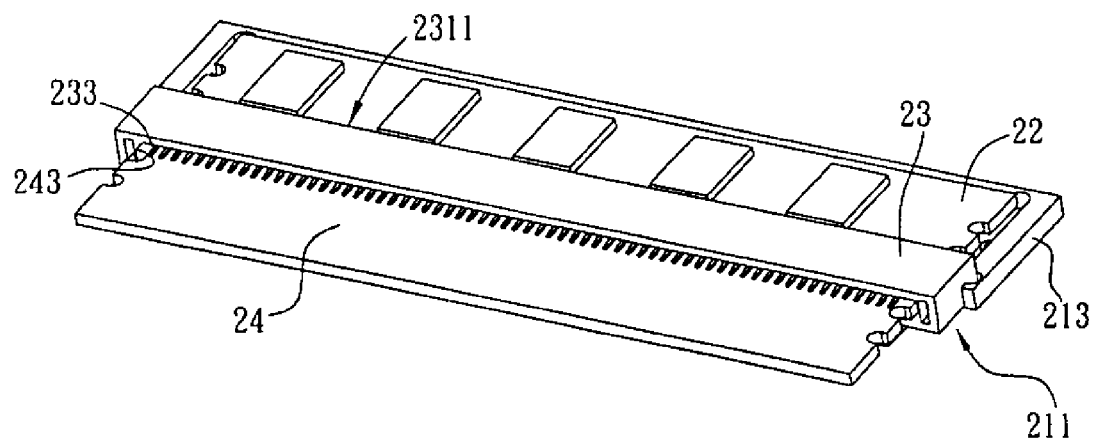
Figure 4C:
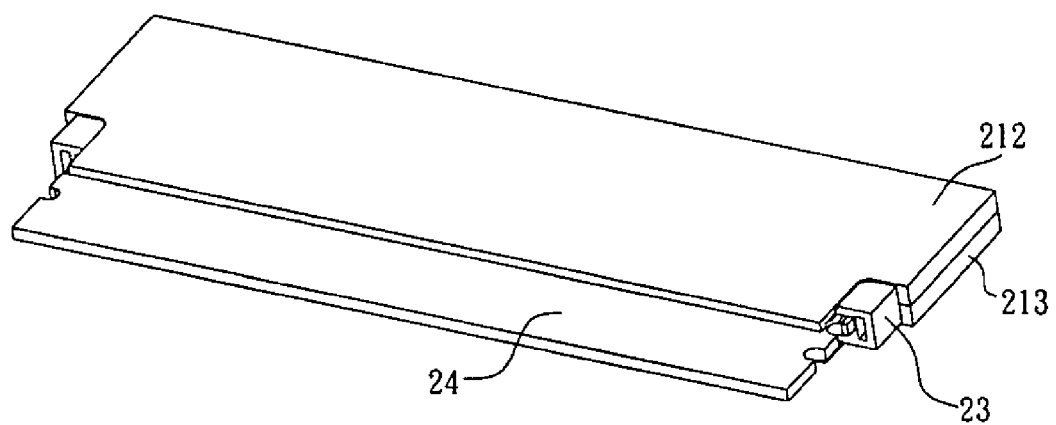

First, as shown in FIG. 4A, the tester positions the lower cover 213 of the protective casing 21. Then, as shown in FIG. 4B, the combined second circuit board 22, second connector 23 and third circuit board 24 are disposed in the lower cover 213 with the second connector 23 being located in the concave portion 211. Finally, as shown in FIG. 4C, the upper cover 212 and the lower cover 213 of the protective casing 21 are combined together such that the testing device 2 is formed.

Figure 5:
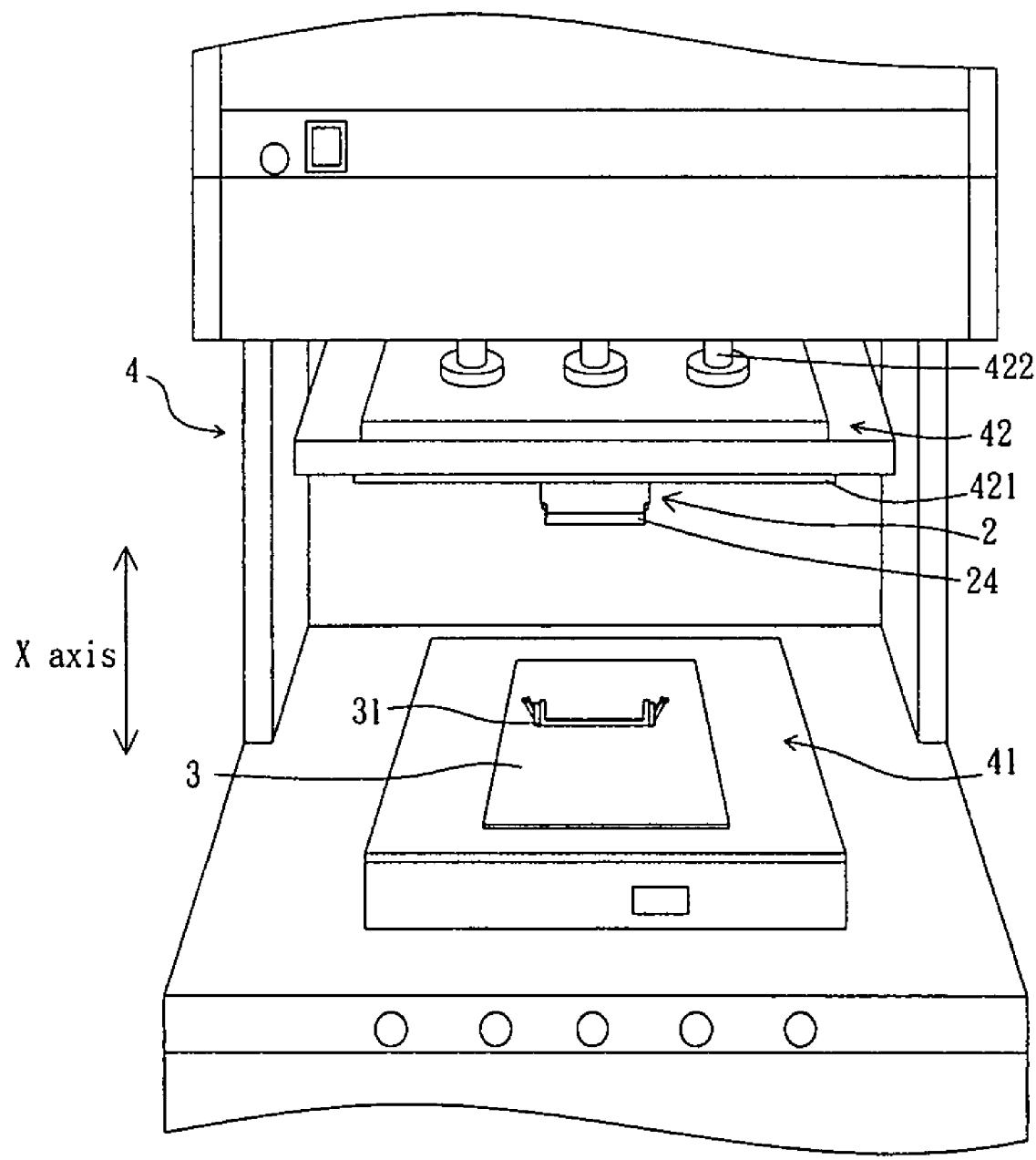
FIG. 5 is a schematic illustration showing the testing device used in conjunction with a testing machine according to the preferred embodiment of the invention.

In addition, as shown in FIG. 5, the testing device 2 of this embodiment may be used in conjunction with a testing machine 4. Herein, the testing machine 4 has a first testing unit 41 and a second testing unit 42, which is disposed above the first testing unit 41 and may be moved close to or away from the first testing unit 41 (i.e., along the axis X of FIG. 5).

In addition, the first circuit board 3 may be disposed on the first testing unit 41, and the testing device 2 may be disposed below the second testing unit 42. Thus, the second testing unit 42 can move the testing device 2 toward the first testing unit 41 so that the third circuit board 24 can be electrically connected to the first connector 31 on the first circuit board 3 and the test can be preformed.

In this embodiment, the first testing unit 41 is a platform on which a flat plate can be placed, and the second testing unit 42 includes a clipping element 421 and a driving element 422. The clipping element 421 clips the testing device 2, and the driving element 422 drives the second testing unit 42 to move.

As mentioned hereinabove, in the testing device according to the invention, the second circuit board is electrically connected to the first circuit board through the second connector and the third circuit board. In addition, the testing device further has the protective casing for protecting the second circuit board. Compared with the prior art, when the tester is testing, he or she does not have to directly contact the second circuit board, but contacts the protective casing. So, the electronic elements on the second circuit board cannot be damaged. In addition, because of the protection of the protective casing, the second circuit board cannot be hit and damaged. Also, when the testing device is inserted and removed, the third circuit board is inserted into the first connector on the first circuit board or is pulled out of the first connector. So, the second circuit board cannot be worn due to the repeated insertion and removal operations. Thus, the second circuit board is not damaged during the test, the testing efficiency and accuracy can be increased, and the manufacturing cost can be reduced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A testing device for testing a first circuit board, the first circuit board having a first connector, the testing device comprising:
   a protective casing;
   a second circuit board having at least one portion disposed in the protective casing;
   a second connector having a first side, which is electrically connected to the second circuit board, and a second side; and
   a third circuit board having a third side, which is electrically connected to the second side of the second connector, and a fourth side, which is electrically connected to the first connector,
   wherein the protective casing covers the second circuit board, the second connector and one portion of the third circuit board.

2. The testing device according to claim 1, wherein the first side of the second connector has a slot, into which the second circuit board is inserted.

3. The testing device according to claim 1, wherein the second side of the second connector has a plurality of first connection portions, the third side of the third circuit board has a plurality of second connection portions, and the first connection portions are respectively connected to the second connection portions.

4. The testing device according to claim 1, wherein the first connector has a slot, into which the fourth side of the third circuit board is inserted.

5. The testing device according to claim 1, wherein the second connector is fixed in the protective casing.

6. The testing device according to claim 1, wherein an inner side of the protective casing has a concave portion corresponding to an arrangement position of the second connector, and the second connector is partially accommodated in the concave portion.

7. The testing device according to claim 1, wherein the first circuit board is a mainboard, the first connector is a memory socket, and the second circuit board is a memory module.

8. A testing device for testing a first circuit board, the first circuit board having a first connector, the testing device comprising:
- a protective casing;
- a second circuit board having at least one portion disposed in the protective casing;
- a second connector having a first side, which is electrically connected to the second circuit board, and a second side; and
- a third circuit board having a third side, which is electrically connected to the second side of the second connector, and a fourth side, which is electrically connected to the first connector, wherein the second connector is fixed in the protective casing.

9. A testing device for testing a first circuit board, the first circuit board having a first connector, the testing device comprising:
- a protective casing;
- a second circuit board having at least one portion disposed in the protective casing;
- a second connector having a first side, which is electrically connected to the second circuit board, and a second side; and
- a third circuit board having a third side, which is electrically connected to the second side of the second connector, and a fourth side, which is electrically connected to the first connector, wherein an inner side of the protective casing has a concave portion corresponding to an arrangement position of the second connector, and the second connector is partially accommodated in the concave portion.

* * * * *